United States Patent
Hwang et al.

(10) Patent No.: US 11,157,040 B2
(45) Date of Patent: Oct. 26, 2021

(54) ELECTRONIC DEVICE INCLUDING METAL HOUSING

(71) Applicant: Samsung Electronics Co., Ltd., Gyeonggi-do (KR)

(72) Inventors: Yongwook Hwang, Gyeonggi-do (KR); Daeyoung Noh, Seoul (KR); Seungchang Baek, Gyeonggi-do (KR); Hyeongsam Son, Gyeonggi-do (KR); Soonwoong Yang, Gyeonggi-do (KR); Byounghee Choi, Gyeonggi-do (KR); Changyoun Hwang, Gyeonggi-do (KR); Minwoo Yoo, Gyeonggi-do (KR)

(73) Assignee: Samsung Electronics Co., Ltd

( * ) Notice: Subject to any disclaimer, the term of this patent is extended or adjusted under 35 U.S.C. 154(b) by 534 days.

(21) Appl. No.: 16/075,050

(22) PCT Filed: Feb. 1, 2017

(86) PCT No.: PCT/KR2017/001068
§ 371 (c)(1),
(2) Date: Aug. 2, 2018

(87) PCT Pub. No.: WO2017/135667
PCT Pub. Date: Aug. 10, 2017

(65) Prior Publication Data
US 2020/0201386 A1 Jun. 25, 2020

(30) Foreign Application Priority Data
Feb. 4, 2016 (KR) .......................... 10-2016-0013899

(51) Int. Cl.
*G06F 1/16* (2006.01)
*H04M 1/02* (2006.01)
(Continued)

(52) U.S. Cl.
CPC .......... *G06F 1/1626* (2013.01); *G06F 1/1656* (2013.01); *H04M 1/0249* (2013.01); *H04M 1/185* (2013.01); *H05K 5/04* (2013.01)

(58) Field of Classification Search
None
See application file for complete search history.

(56) References Cited

U.S. PATENT DOCUMENTS 9,143,586 B2 * 9/2015 Allore ................ H04M 1/0202
9,872,407 B2 * 1/2018 Inobe ..................... G06F 1/1643
(Continued)

FOREIGN PATENT DOCUMENTS

CN 201877591 6/2011
CN 102811264 12/2012
(Continued)

OTHER PUBLICATIONS

Chinese Office Action dated Mar. 16, 2020 issued in counterpart application No. 201780009750.7, 20 pages.
(Continued)

*Primary Examiner* — Xanthia C Cunningham
(74) *Attorney, Agent, or Firm* — The Farrell Law Firm, P.C.

(57) ABSTRACT

An electronic device comprises: a metal frame including an opening in the center portion thereof; a metal plate included in the opening and having at least a part spaced apart from the metal frame; a coupling member securing the metal plate to the metal frame while filling the space between the metal frame and the metal plate; a printed circuit board brought into contact with or disposed adjacent to one surface of the metal plate; a communication module mounted on the printed circuit board and electrically connected to at least a part of the metal frame; a display brought into contact with or disposed adjacent to the surface of the metal plate or
(Continued)

another surface thereof; a first plate covering at least a part of the display device while forming a part of an external housing together with the metal frame; and a second plate covering the opposite side of the display device while forming a part of the external housing together with the metal frame.

8 Claims, 25 Drawing Sheets

(51) Int. Cl.
*H04M 1/18* (2006.01)
*H05K 5/04* (2006.01)

(56) References Cited

U.S. PATENT DOCUMENTS

| | | | | |
|---|---|---|---|---|
| 2009/0268120 | A1* | 10/2009 | Ogatsu | G02F 1/133308 349/58 |
| 2013/0027892 | A1* | 1/2013 | Lim | H04M 1/0283 361/748 |
| 2013/0155627 | A1 | 6/2013 | Mareno et al. | |
| 2013/0170156 | A1* | 7/2013 | Jung | G06F 1/1601 361/749 |
| 2014/0198464 | A1 | 7/2014 | Yi et al. | |
| 2015/0043141 | A1 | 2/2015 | Pegg et al. | |
| 2015/0155614 | A1 | 6/2015 | Youn et al. | |
| 2015/0356931 | A1* | 12/2015 | Kitoh | G06F 1/1626 345/173 |
| 2016/0269067 | A1* | 9/2016 | Pidwerbecki | H05K 3/284 |

FOREIGN PATENT DOCUMENTS

| | | |
|---|---|---|
| CN | 103105971 | 5/2013 |
| EP | 2 755 367 | 7/2014 |
| JP | 2014187526 | 10/2014 |
| KR | 100761087 | 9/2007 |
| KR | 101443563 | 9/2014 |
| KR | 101443565 | 11/2014 |
| KR | 101568343 | 11/2015 |
| KR | 101571288 | 11/2015 |

OTHER PUBLICATIONS

European Search Report dated Oct. 29, 2018 issued in counterpart application No. 17747712.2-1216, 7 pages.
PCT/ISA/210 Search Report issued on PCT/KR2017/001068 (pp. 3).
PCT/ISA/237 Written Opinion issued on PCT/KR2017/001068 (pp. 5).

* cited by examiner

ELECTRONIC DEVICE INCLUDING METAL HOUSING

PRIORITY

This application is a National Phase Entry of PCT International Application No. PCT/KR2017/001068 which was filed on Feb. 1, 2017, and claims priority to Korean Patent Application No. 10-2016-0013899, which was filed on Feb. 4, 2016, the content of each of which is incorporated herein by reference.

TECHNICAL FIELD

Various embodiments of the present invention relate to a metal housing and a method for providing the metal housing.

BACKGROUND ART

According to the recent development of digital technologies, various electronic devices enabling mobile communication and personal information processing, such as a mobile terminal, PDA (personal digital assistant), electronic organizer, smartphone, and tablet PC (personal computer), are being introduced into the market. Such electronic devices do not remain in their own traditional areas and a mobile convergence step has been reached by each of them merging into the areas of other terminals. Typically, an electronic device can provide functions of voice communication and video communication, message transmission functions of SMS (short message service) and MMS (multimedia message service), email function, electronic organizer function, camera function, broadcasting play function, video play function, music play function, internet function, messenger function, and SNS (social networking service) function. As described above, the trend of electronic devices is one of expanding functions, and it is also of improving an aesthetic impression by reducing thickness and increasing a display size.

DISCLOSURE OF INVENTION

Technical Problem

As the thickness of the electronic device becomes slimmer and the screen size becomes greater, a rigid case is required. A housing of the electronic device can be provided by using a metal in order to secure the rigidity of the electronic device and improve an aesthetic impression of an exterior.

In case of providing a housing of an electronic device by using a metal, manufacturing costs of the electronic device increase because expensive processing equipment must be used and a user may experience electric shock problems because the housing is configured with a metal.

An object of an electronic device and a method for providing a metal housing according to various embodiments of the present invention is to integrate the metal housing and a bracket supporting a display.

Solution to Problem

In order to solve the above or other problems, an electronic device according to various embodiments may include a metal frame including an opening at a center part of the metal frame, a metal plate included in the opening and having at least one part displaced from the metal frame, a bonding member configured to fix the metal plate to the metal frame and fill a gap between the metal frame and the metal plate, a printed circuit board configured to contact with or disposed adjacent to a surface of the metal plate, a communication module mounted on the printed circuit board and electrically connected to at least one part of the metal frame, a display configured to contact with or disposed adjacent to the surface of the metal plate or another surface of the metal plate, a first plate configured to cover at least one part of the display and form a part of an external housing together with the metal frame, and a second plate configured to cover the opposite side of the display while forming a part of the external housing together with the metal frame.

A method for manufacturing an electronic device according to various embodiments may include the operations of fixing a metal frame having a first surface and a second surface opposite to the first surface, and including an opening piercing the second surface from the first surface at the center part of the metal frame and at least one through hole smaller than the opening disposed at the periphery of the metal frame, in an extruder by using at least one part of the through hole; disposing at least one part of a metal plate in the opening by displacing from the metal frame; filling a bonding member between the metal frame and the metal plate by using the extruder; taking out a structure including the metal frame, the metal plate, and the bonding member from the extruder; and forming the metal frame having no through hole by cutting off at least one part of the periphery including the through hole.

In the electronic device including a metal housing disposed between a display and a rear cover according to various embodiments, the metal housing may include a metal frame including an opening disposed at a center part of the metal housing, a metal plate included in the opening and having at least one part displaced from the metal frame, and a bonding member configured to fix the metal frame and fill a gap between the metal frame and the metal plate.

Advantageous Effects of Invention

An electronic device including a metal housing and a method for providing the metal housing according to various embodiments of the present invention can save manufacturing costs of the electronic device by integrating a bracket supporting the metal housing and a display, and it can protect a user from an electric shock by separating electrically the metal housing and the bracket.

MODE FOR THE INVENTION

Figure 1A:
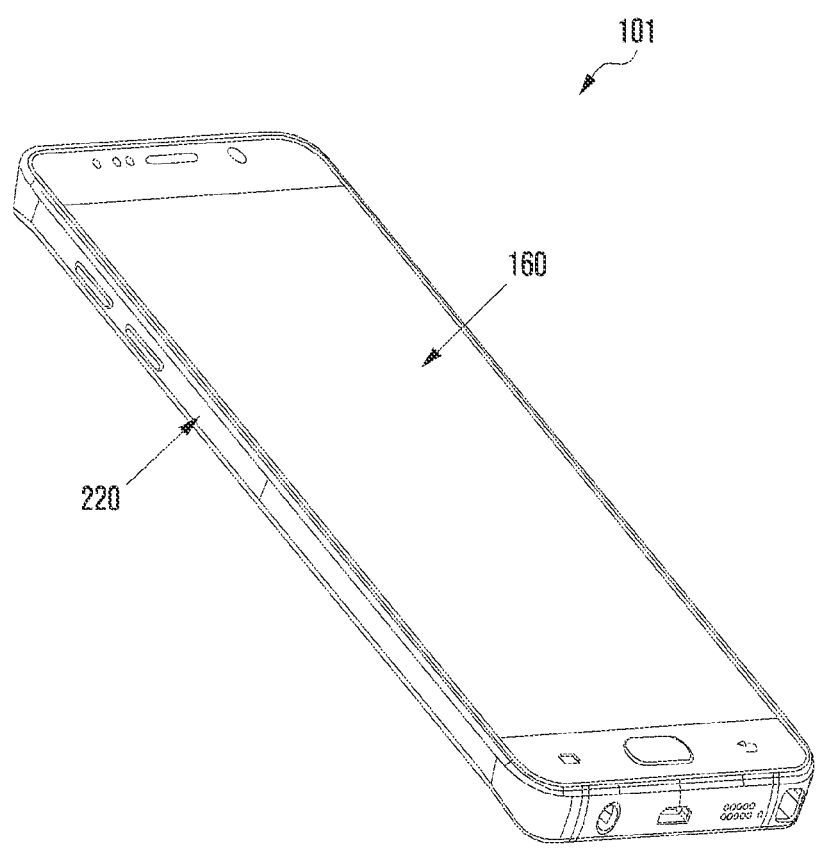
FIGS. 1a to 1g illustrate an electronic device according to various embodiments of the present invention.

Hereinafter, embodiments of the present invention are described in detail with reference to the accompanying drawings. While the present invention may be embodied in many different forms, certain embodiments of the present invention are shown in the accompanying drawings and are described herein in detail, with the understanding that the present invention is not intended to be limited to the embodiments. The same reference numbers are used throughout the accompanying drawings to refer to the same or like parts.

The expressions "having", "may have", "comprising", and "may comprise" used in the present disclosure indicate the presence of a corresponding characteristic (e.g., numerical value, function, operation, or element) and do not limit any additional at least one function, operation, or element.

In the present disclosure, expressions "A or B", "at least one of A and/or B", and "one or more A and/or B" may include one of the listed words and their combinations. For example, "A or B", "at least one of A and B", and "at least one A or B" may mean all the cases of (1) including at least one A, (2) including at least one B, and (3) including at least one A and at least one B.

The expressions "first" and "second" used in the present disclosure may represent various elements of the present invention, but they do not limit corresponding elements. For example, the expressions do not limit an order and/or importance of corresponding elements. The expressions may be used for distinguishing one element from another element. For example, both a first user device and a second user device are user devices and represent different user devices. For example, a first element may be referred to as a second element without deviating from the scope and spirit of the present invention and, similarly, a second element may be referred to as a first element.

When it is described that an element (e.g., first element) is operatively or communicatively "connected" with/to another element (e.g., second element), the element may be directly connected to the other element or connected through a further other element (e.g., third element). However, when it is described that an element (e.g., first element) is "directly coupled" to another element (e.g., second element), no element (e.g., third element) may exist between the element and the other element.

An expression "configured to" used in the present disclosure may be interchangeably used, according to the situation, with "suitable for", "having the capacity to", "designed to", "adapted to", "made to", or "capable of". The term "configure to" may not always mean "specially designed to" in hardware. Instead, in a certain situation, an expression "device configured to" may mean that the device is "capable of" some functions together with other devices or components. For example, the wording "a processor configured to perform A, B, and C" may mean a dedicated processor (e.g., imbedded processor) for performing a corresponding operation or a generic-purpose processor (e.g., CPU or application processor) that can perform corresponding operations by executing at least one software program stored in a memory device.

Terms used in the present disclosure are not intended to limit the present invention, and they merely illustrate embodiments of the present invention. When used in a description of the present invention, a singular form includes a plurality of forms unless it is explicitly represented differently. Unless the context clearly dictates otherwise, all the terms including a technical or scientific term used in the present disclosure will have the same meaning generally understood by those skilled in the art. It should be understood that terms defined in a generally used dictionary have the same meaning as in a related technical context, and they are not to be interpreted in an abnormal or excessively formal meaning unless clearly indicated in the present disclosure. In some cases, the term defined in the present disclosure may not be interpreted to exclude embodiments of the present disclosure.

For example, the electronic device according to various embodiments of the present disclosure may include at least one of a smartphone, tablet PC (tablet personal computer), mobile phone, video phone, e-book reader, desktop PC (desktop personal computer), laptop PC, netbook computer, workstation, server, PDA (personal digital assistant), PMP (portable multimedia player), MP3 player, mobile medical equipment, camera, or wearable device. According to various embodiments, the wearable device may include at least one of an accessory type (e.g., watch, ring, bracelet, anklet, necklace, glasses, contact lenses, or head-mounted-device (HMD)), fabric or cloth integrated type (e.g., electronic clothing), body attaching type (e.g., skin pad or tattoo), or bio-implant type (e.g., implantable circuit).

In an embodiment, the electronic device may be a home appliance. The home appliance may include at least one of a television, DVD (digital video disk) player, audio device, refrigerator, air conditioner, vacuum cleaner, oven, microwave, washing machine, air cleaner, set-top box, home automation control panel, security control panel, TV box (e.g., Samsung HomeSync™, Apple TV™, or Google TV™), game console (e.g., Xbox™ or PlayStation™), electronic dictionary, electronic key, camcorder, or electronic picture frame.

In another embodiment, the electronic device may include at least one of various pieces of medical equipment (e.g., various portable medical measurement equipment (blood glucose monitor, heartrate monitor, blood pressure measuring device, or clinical thermometer), MRA (magnetic resonance angiography) device, MRI (magnetic resonance imaging) device, CT (computed tomography) device, movie camera, or ultrasonic device), navigation device, GNSS (global navigation satellite system), EDR (event data recorder), FDR (flight data recorder), automobile infotainment device, electronic device for a ship (e.g., navigation equipment for a ship and gyro compass), avionics, security device, head unit for automobile, industrial or home robot, ATM (automatic teller machine) in a financial institution, POS (point of sales) in a shop, or internet of things (e.g., electric bulb, various sensors, electric or gas meter, spring cooler, fire alarm, thermostat, streetlight, toaster, fitness equipment, hot-water tank, heater, and boiler).

According to an embodiment, the electronic device may include at least one piece of furniture, part of a building/ structure, electronic board, electronic signature receiving device, projector, or various meters (e.g., water, electricity, gas, or radio measuring equipment). In various embodiments, the electronic device may include at least one of the aforementioned devices or their combinations. An electronic device according to an embodiment may be a flexible electronic device. Further, the electronic device according to an embodiment of the present disclosure is not limited to the aforementioned equipment and may include a new electronic device according to a technical development.

Hereinafter, the electronic device according to various embodiments will be described with reference to the accompanying drawings. In the present disclosure, a term "user" may indicate a person using an electronic device or a device using an electronic device (e.g., artificial intelligence electronic device).

FIGS. 1a to 1g illustrate an electronic device according to various embodiments of the present invention.

FIG. 1a is perspective view illustrating the electronic device 101 according to various embodiments of the present invention. The electronic device 101 may include a display 160 and a metal frame 220 configuring an exterior of the electronic device 101. The electronic device 101 can expose at least one part of the display 160 in a first direction such as a front direction. The metal frame 220 can configure a housing of the electronic device 101 together with the display 160 included at the front surface of the electronic device 101 and a rear case included at the rear side of the electronic device 101. The metal frame 220 can form a space in the electronic device 101 as an internal space, together with the display 160 included at the front surface of the electronic device 101 and the rear case included at the rear side of the electronic device 101. Electronic components of the electronic device 101 such as a printed circuit board or a battery electronic device 101 can be installed in the internal space. The metal frame 220 can include an opening, and a metal plate can be disposed in the opening by electrically displacing from the metal frame 220. At least one of an insulating material or a non-metallic material is disposed between the metal frame 220 and the metal plate, and the insulating material or the non-metallic material can be integrated by electrically separating the metal frame 220 and the metal plate.

The display 160 may include a panel, hologram device, or projector. The panel can be provided in a flexible, transparent, or wearable form. The panel may be configured with a touch panel in a module. The hologram device can show a 3D image in the air by using light interference. The projector can display an image by projecting light on a screen. The screen may be located inside or outside of the electronic device 101. According to an embodiment, the display 160 may further include a control circuit for controlling the panel, hologram device, or projector.

According to various embodiments, the electronic device 101 may include a power management module. The power management module may manage an electric power of the electronic device 101. According to an embodiment, the power management module may include a PMIC (power management integrated circuit), charger IC (charger integrated circuit), or battery or fuel gauge. The PMIC may use a wired and/or wireless charging method. The wireless charging method may include a magnetic resonance method, magnetic induction, or electromagnetic wave method, and it may further include an additional circuit for wireless charging such as a coil loop, resonance circuit, or rectifier. The battery gauge can measure a residual amount, voltage, current, or temperature of a battery while charging the battery. The battery may include a rechargeable battery and/or a solar battery.

Figure 1B:
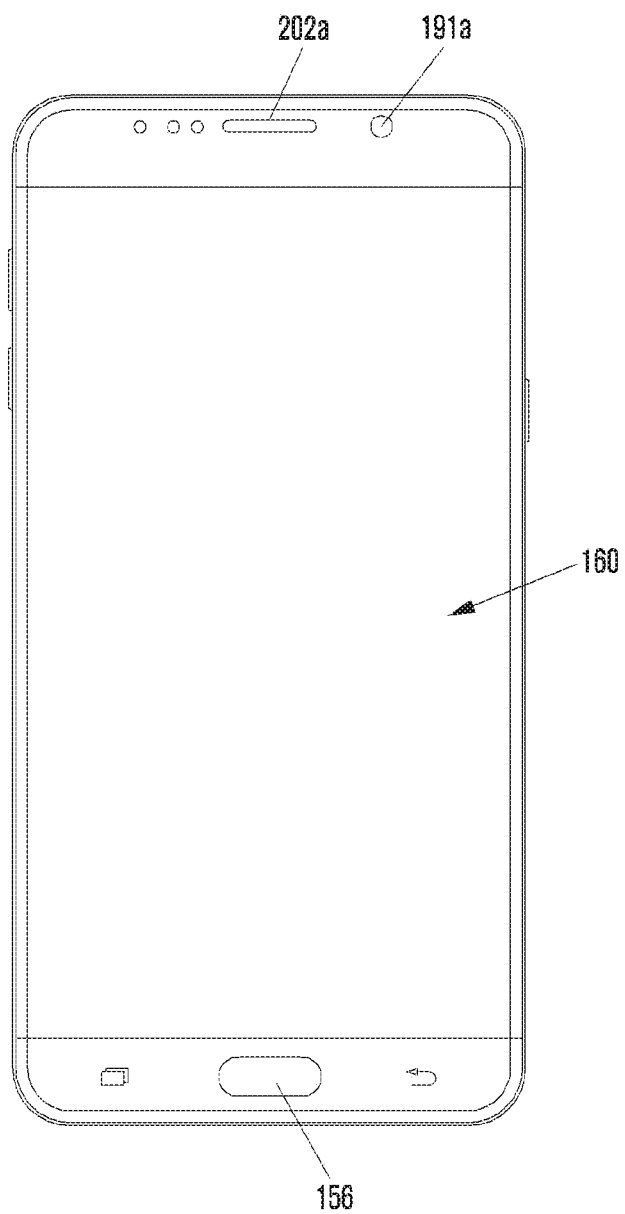

FIG. 1b is a front view illustrating an electronic device 101 according to various embodiments of the present invention. The electronic device 101 may can expose at least one part of the display 160 in a first direction such as a front direction. The display 160 may include a component such as a window and a display device (e.g., display panel). The window of the display 160 may be configured with tempered glass and exposed in a first direction such as a front direction of the electronic device 101. The window of the display 160 may configure a housing of the electronic device 101 together with a metal frame 201 and a rear cover of the electronic device 101. The housing of the electronic device 101 may include the window as a first plate and the rear cover as a second plate.

At least one part of the front surface of the electronic device 101 may include a key 156, camera window 191a, and first speaker hole 202a. The key 156, camera window 191a, and first speaker hole 202a included in the at least one part of the front surface of the electronic device 101 may be exposed to the outside. The key 156 included in the at least one part of the electronic device 101 may be a physical key such as a home key. The first speaker hole 202a of the electronic device 101 can transmit a sound output by a speaker 182 to the outside. In order to help photographing such as taking a selfie, at least one camera module 191 may be disposed at the front surface of the electronic device 101. The camera window 191a can protect the at least one camera module 191 disposed at the front surface.

According to various embodiments, the key 156 may include a physical button, optical key, or keypad.

According to various embodiments, the electronic device 101 may include an audio module. The audio module can convert a sound and an electric signal bilaterally. The audio module can process sound information input or output through a speaker 182, earphone, or microphone.

According to various embodiments, the camera module 191 is a device for photographing a still image or a moving image. According to an embodiment, the camera module may include at least one image sensor (e.g., front sensor or rear sensor), lens, ISP (image signal processor), or flashlight (e.g., LED or xenon lamp).

Figure 1C:
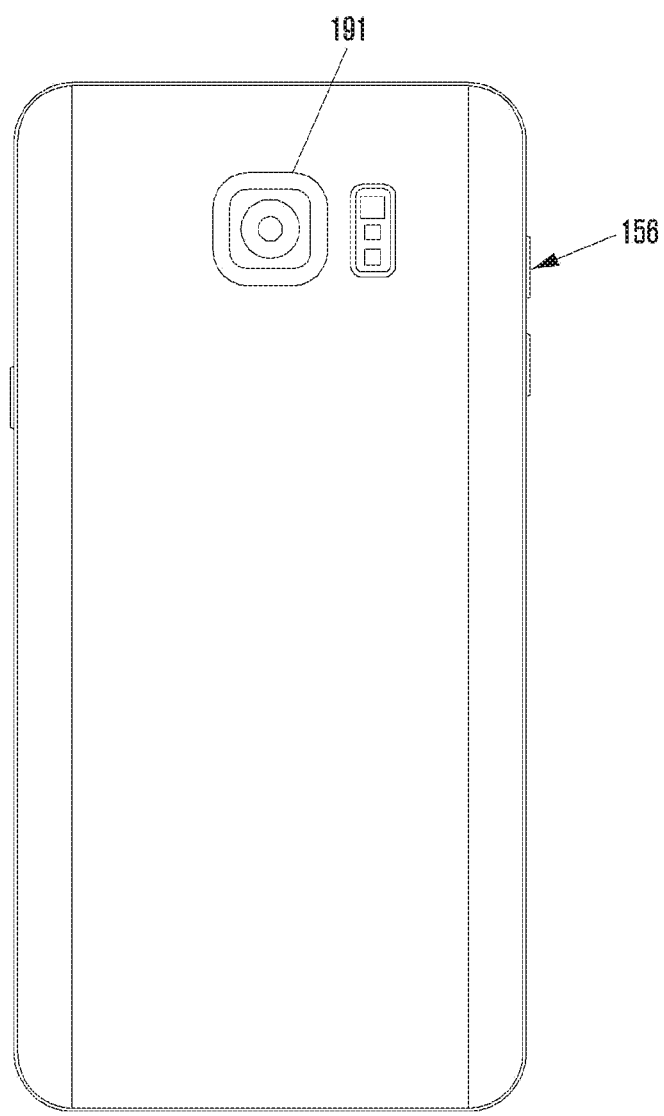

FIG. 1c is a rear view illustrating an electronic device 101 according to various embodiments of the present invention. At least one part of the rear surface of the electronic device 101 may include a camera module 191. At least one part of a side surface of the electronic device 101 may include a key 156. The key 156 included in the at least one part of the side surface of the electronic device 101 may be a volume key. The rear surface of the electronic device 101 may expose a rear cover. The rear cover may be configured with various materials such as tempered glass, metal, synthetic resin (e.g., plastic), wood, fabric, or leather.

Figure 1D:
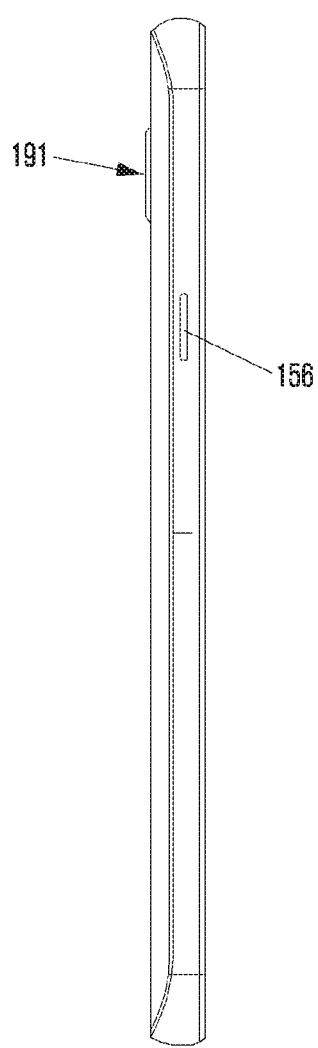
Figure 1E:
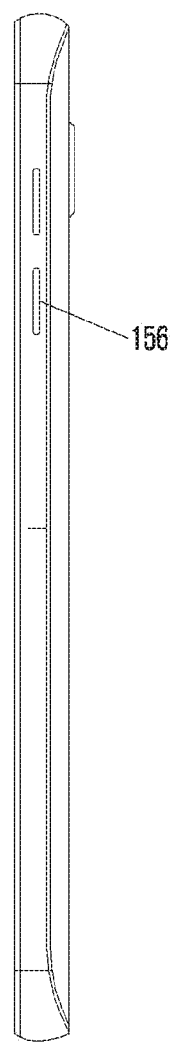

FIG. 1d is a left side view illustrating an electronic device 101 according to various embodiments of the present invention, and FIG. 1e is a right side view illustrating an electronic device 101 according to various embodiments of the present invention. At least one part of a rear surface of the electronic device 101 may include a camera module 191. At least one part of a side surface of the electronic device 101 may include a key 156. The key 156 included in the at least one part of the side surface of the electronic device 101 may be a volume key or a power key.

Figure 1F:
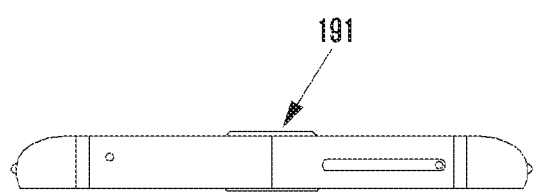
Figure 1G:
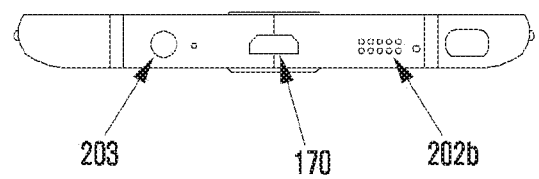

FIG. 1f is an upper side view illustrating an electronic device 101 according to various embodiments of the present invention, and FIG. 1g is a lower side view illustrating an electronic device 101 according to various embodiments of the present invention. At least one part of the lower side of the electronic device 101 may include a second speaker hole 202b, earphone hole 203, or interface 170. The earphone hole 203 may be docked or connected by an external earphone.

The interface 170 may include a HDMI (high-definition multimedia interface), USB (universal serial bus), optical interface, or D-sub (D-subminiature). Additionally or alternatively, the interface 170 may include an MHL (mobile high-definition link) interface, SD (secure digital) card/MMC (multi-media card) interface, or IrDA (infrared data association) specification interface.

Figure 2:
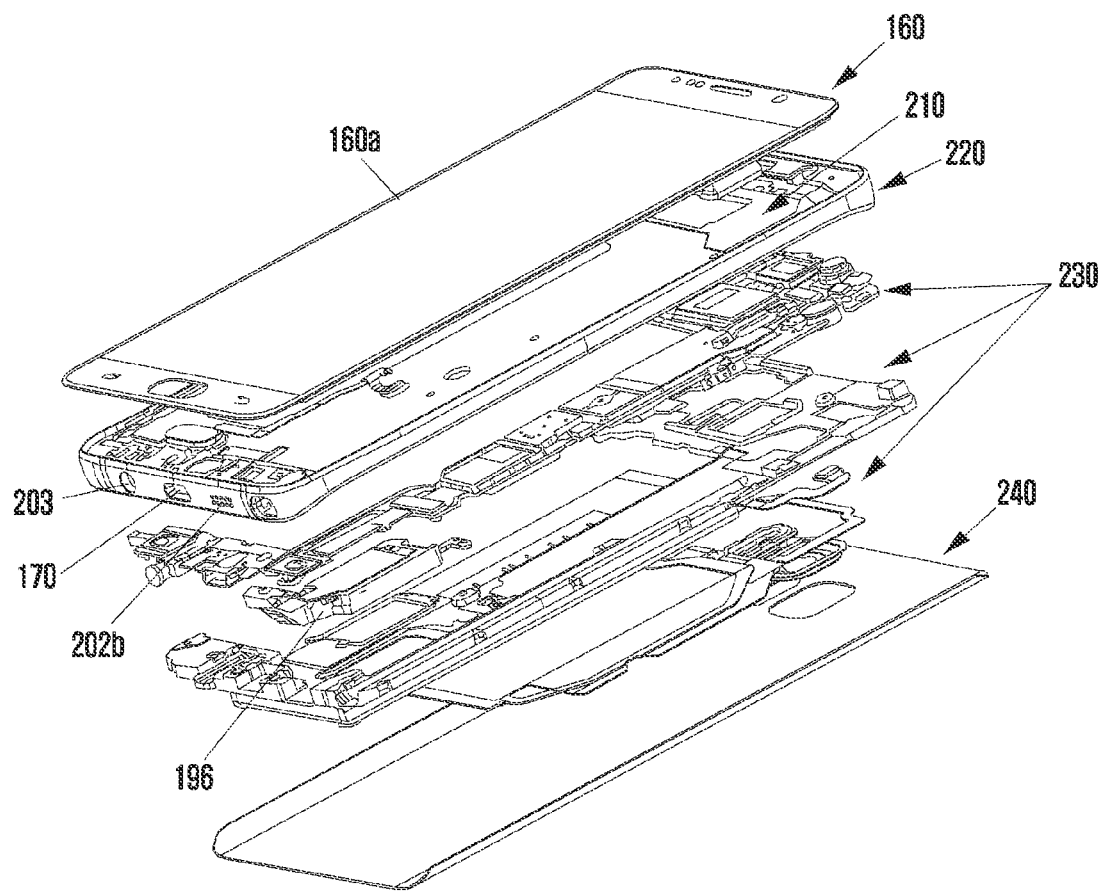
FIG. 2 is an exploded perspective view illustrating an electronic device according to various embodiments of the present invention.

FIG. 2 is an exploded perspective view illustrating an electronic device according to various embodiments of the present invention.

According to various embodiments, the electronic device 101 may combine the display 160, metal plate 210, metal frame 220, printed circuit board 230, and rear cover 240 in order. The metal plate 210 can take a role of a bracket for the display 160. The metal plate 210 can fix the display 160 to the electronic device 101. A printed circuit board 230 may be disposed in the metal plate 210. The display 160 can expose a window 160a to the outside. The window of the display 160 may configure a front external surface of the electronic device 101, and the rear cover 240 may configure a rear external surface of the electronic device 101. The window of the display 160 may configure a first external surface of the electronic device 101, and the rear cover 240 may configure a second external surface of the electronic device 101. The metal frame 220 may configure a side member of the electronic device 101. The window of the display 160, rear cover 240, and metal frame 220 may configure an external housing of the electronic device 101. The metal plate 210 and metal frame 220 can be configured in an integral form. At least one part of the metal frame 220 may include a second speaker hole 202b, earphone hole 203, or interface 170. The earphone hole 203 can be docked or connected by an external earphone. A battery 196 or an antenna may be disposed in at least one part of the printed circuit board 230.

FIGS. 3a to 3d illustrate a metal housing 300 of an electronic device 101 according to various embodiments of the present invention.

Figure 3A:
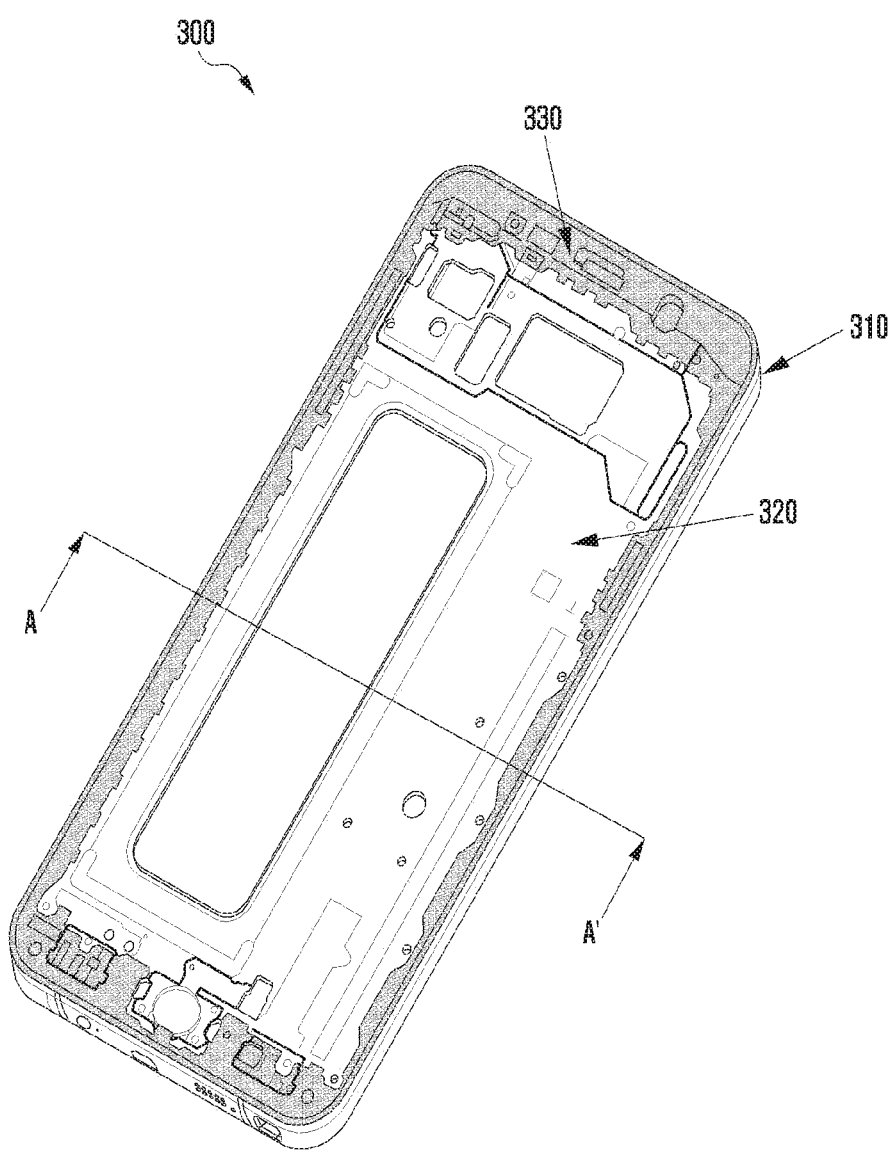
FIGS. 3a to 3d illustrate a metal housing of an electronic device according to various embodiments of the present invention.
Figure 3B:
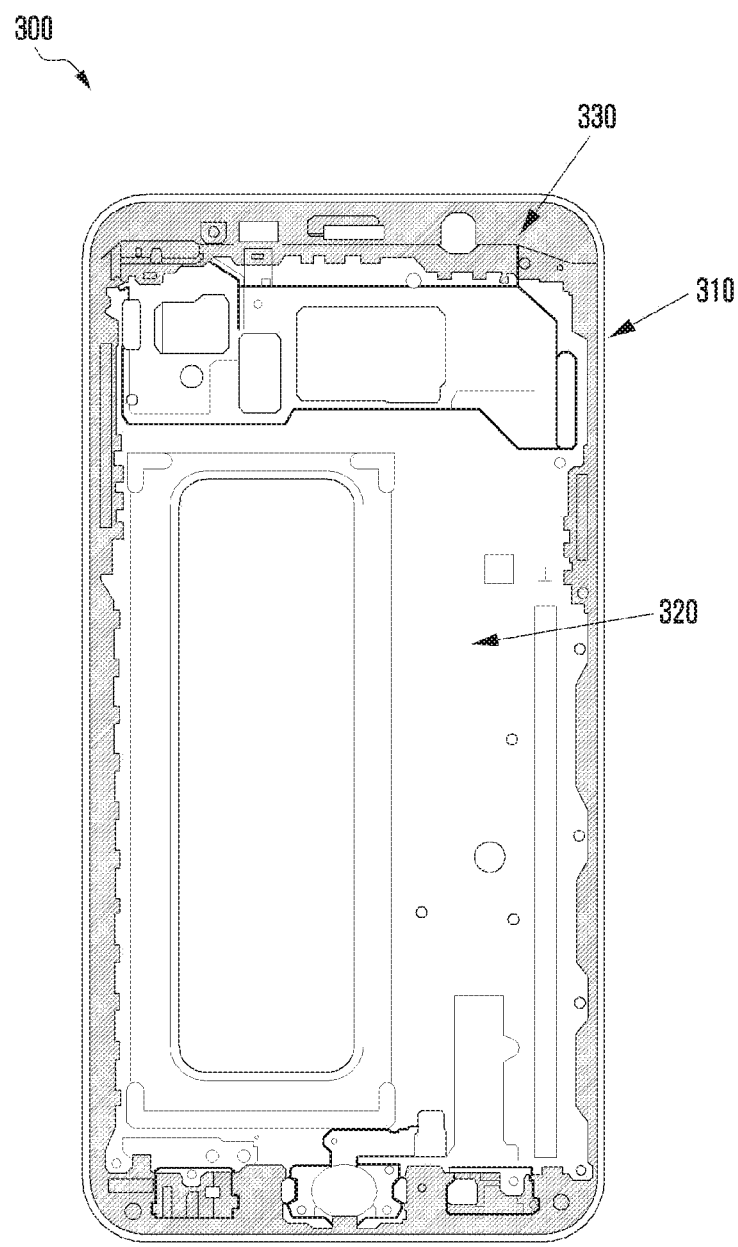
Figure 3C:
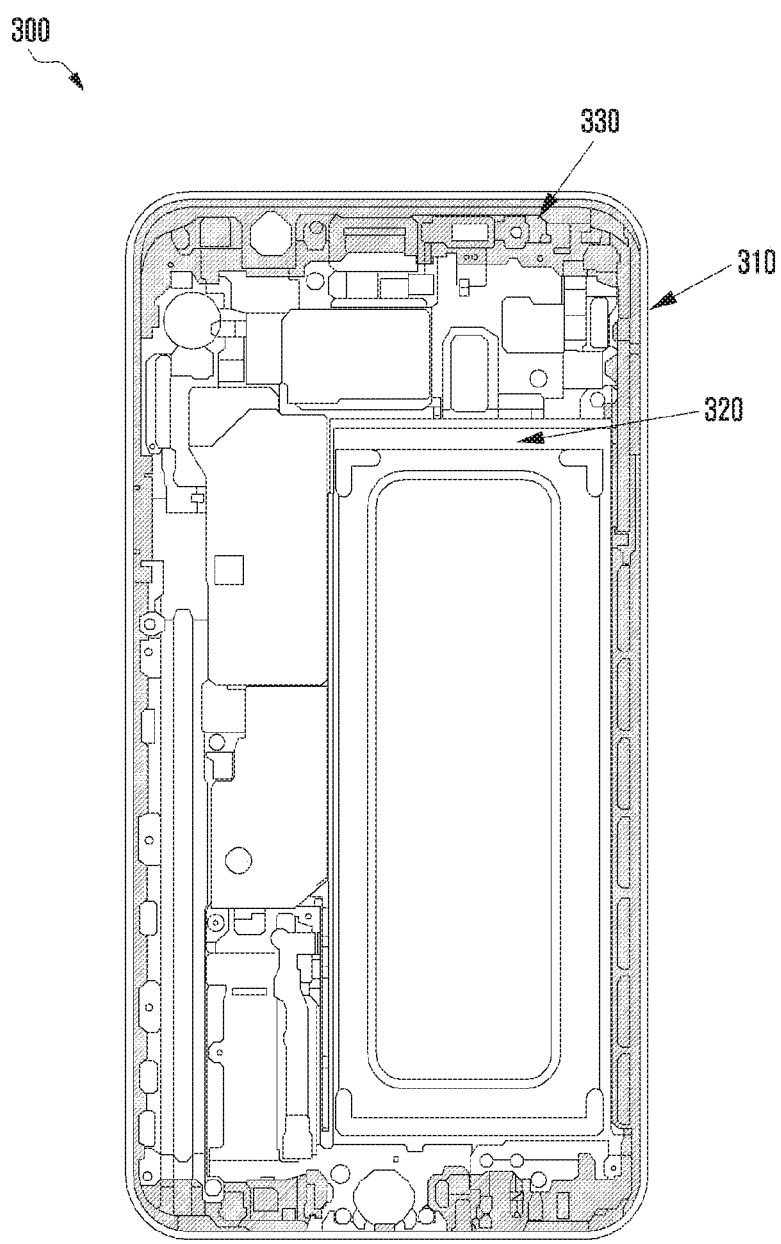
Figure 3D:
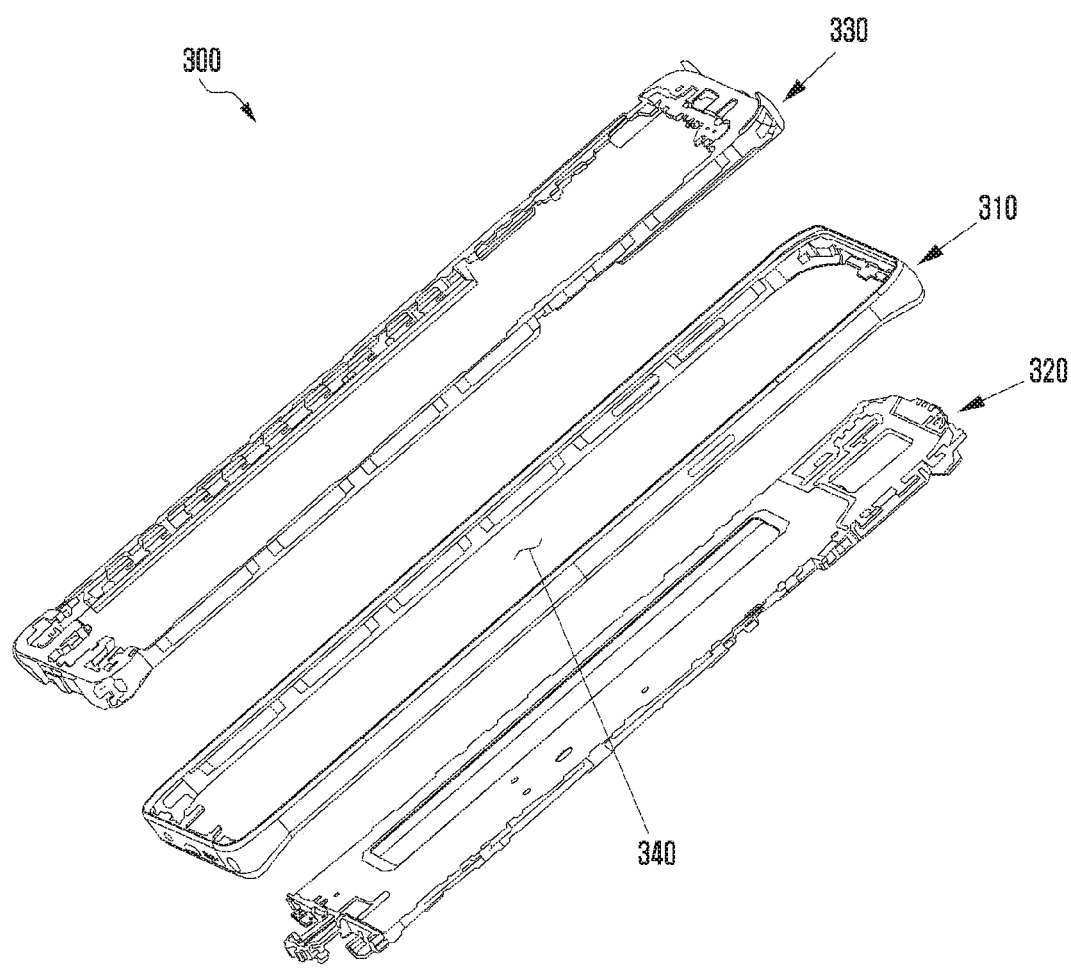

FIG. 3a is a perspective view illustrating a metal housing 300 of an electronic device 101 according to various embodiments of the present invention, FIG. 3b is a front view illustrating a metal housing 300 of the electronic device 101 according to various embodiments of the present invention, FIG. 3c is a rear view illustrating a metal housing 300 of the electronic device 101 according to various embodiments of the present invention, and FIG. 3d is an exploded perspective view illustrating a metal housing 300 of the electronic device 101 according to various embodiments of the present invention.

With reference to FIGS. 3a to 3d, the metal housing 300 of the electronic device 101 may include a metal frame 310, metal plate 320, and non-conductive bonding member 330.

According to various embodiments, the metal frame 310 may be a metal frame 220 of FIG. 2 or a metal frame 220 of FIG. 1a.

According to various embodiments, the material of the metal frame 310 may be at least one of an aluminum alloy, stainless steel, titanium alloy, or non-crystalline metal. The metal frame 310 can be formed by processing (e.g., CNC (computer numerical control) process) after primarily forming with at least one manufacturing method of extrusion, forging, pressing, and casting.

According to various embodiments, the material of the metal plate 320 may be at least one of an aluminum alloy, stainless steel, titanium alloy, or non-crystalline metal. The metal plate 320 can be formed by at least one manufacturing method of die casting, forging, extrusion, or pressing.

According to various embodiments, the material of the metal frame 310 and the material of the metal plate 320 may include at least one different metallic material. According to various embodiments, the material of the metal frame 310 and the material of the metal plate 320 may include identical metallic materials but having different compositions.

According to various embodiments, the metal plate 320 can take a role of bracket of the display 160. The metal plate 320 can fix the display 160 to the electronic device 101. A printed circuit board may be disposed in the metal plate 320. The printed circuit board may install or include at least one of a communication module and a processor electrically connected to at least one part of the metal frame 310. The metal frame 310 can take a role of an antenna by electrically connecting to the communication module. The printed circuit board can be disposed by contacting with a side of the metal plate 320 or adjacent to the metal plate 320. The display 160 can be disposed by contacting with a side or another side of the metal plate 320, or adjacent to a side or another side of the metal plate 320. At least one part of the metal plate 320 may include a combining structure to dispose the printed circuit board. At least one part of the metal plate 320 may include a support structure in order to fix the display 160 to the electronic device 101.

The processor can control a plurality of hardware or software components by driving an operating system or an application program and perform various data processing and operations. The processor may be configured with an SoC (system on chip). According to an embodiment, the processor may further include a GPU (graphic processing unit) and/or an image signal processor. The processor may include at least one of the components of the electronic device 101 (e.g., communication module). The processor can process commands or data received from other components (e.g., non-volatile memory) by loading into a volatile memory and store various data in the non-volatile memory.

The communication module may include a cellular module, WiFi module, Bluetooth module, GNSS module (e.g., GPS module, Glonass module, Beidou module, or Galileo module), NFC module, and RF (radio frequency) module.

The cellular module can provide a voice communication, video communication, text messaging service, or internet service through a communication network. According to an embodiment, the cellular module can perform identification or authentication of the electronic device 101 in a communication network by using a subscriber identification module (e.g., SIM card). According to an embodiment, the cellular module can perform at least one of functions provided by the processor. According to an embodiment, the cellular module may include a CP (communication processor).

Each of the WiFi module, Bluetooth module, GNSS module, and NFC module may include a processor for processing data transmitted by a corresponding module. According to an embodiment, at least one (i.e., more than one) of the cellular module, WiFi module, Bluetooth module, GNSS module, or NFC module can be included in an integrated chip (IC) or an IC package.

The RF module can transmit or receive a communication signal (e.g., RF signal). The RF module may include a transceiver, PAM (power amp module), frequency filter, LNA (low noise amplifier), or antenna. According to another embodiment, at least one of the cellular module, WiFi module, Bluetooth module, GNSS module, or NFC module may transmit or receive an RF signal through a separate RF module.

According to various embodiments, a material of a non-conductive bonding member 330 may be at least one of polymer resins such as polyphenylene sulfide (PPS), polybutylene terephthalate (PBT), polyimide (PI), polycarbonate (PC), and acrylonitrile butadiene styrene (ABS), and it may include proper mineral particles (ceramic or glass fiber) to reinforce a mechanical property.

According to various embodiments, the metal plate 320 may be disposed in a state of displacing from an opening 340 of the metal frame 310, and if a non-conductive bonding member 330 is molded by an extruder through insert injection molding, the non-conductive bonding member 330 can physically or chemically combine and electrically separate the metal frame 310 and the metal plate 320.

Figure 4A:
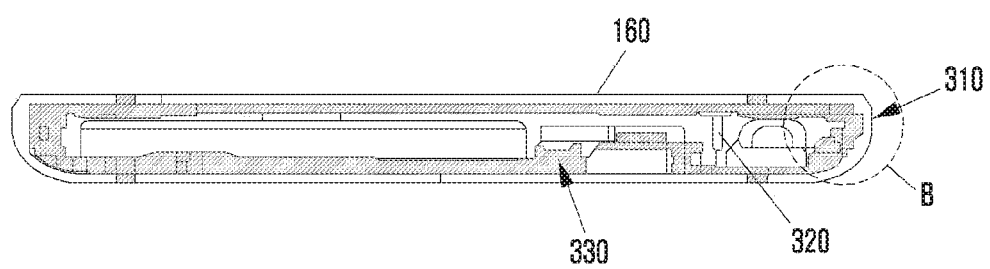
FIGS. 4a to 4b are cross-sectional views illustrating a metal housing cut along the direction A-A' of FIG. 3a according to various embodiments of the present invention.
Figure 4B:
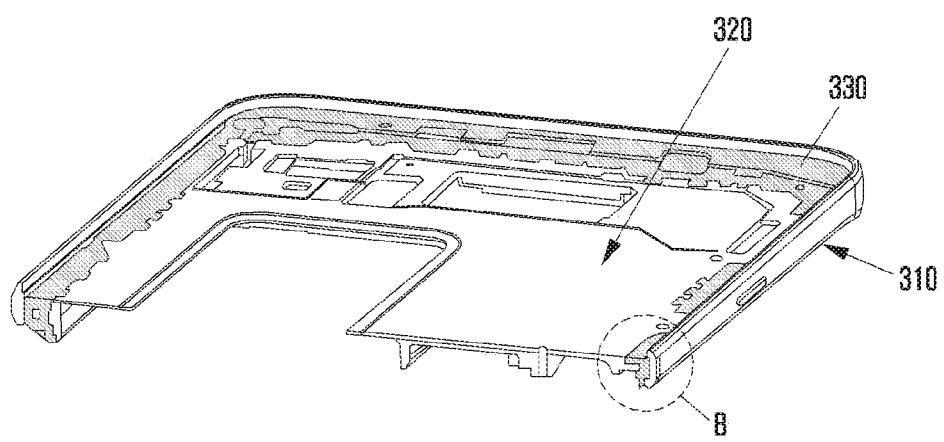

FIGS. 4a to 4b are cross-sectional views illustrating a metal housing 300 cut along the direction A-A' of FIG. 3a according to various embodiments of the present invention.

FIG. 4a is a cross-sectional view illustrating an electronic device 101 including a metal housing 300 according to various embodiments of the present invention. The display 160 may be disposed in a first direction such as a front direction of the electronic device 101. A rear cover may be disposed in a second direction opposite to the first direction such as a rear direction of the electronic device 101. The metal frame 310, display 160, and rear cover may form a housing or an exterior of the electronic device 101. The metal plate 320 disposed at the opening 340 of the metal frame 310 and displaced from the metal frame 310 may be combined with the metal frame 310 physically or chemically by the non-conductive bonding member 330.

Figure 4C:
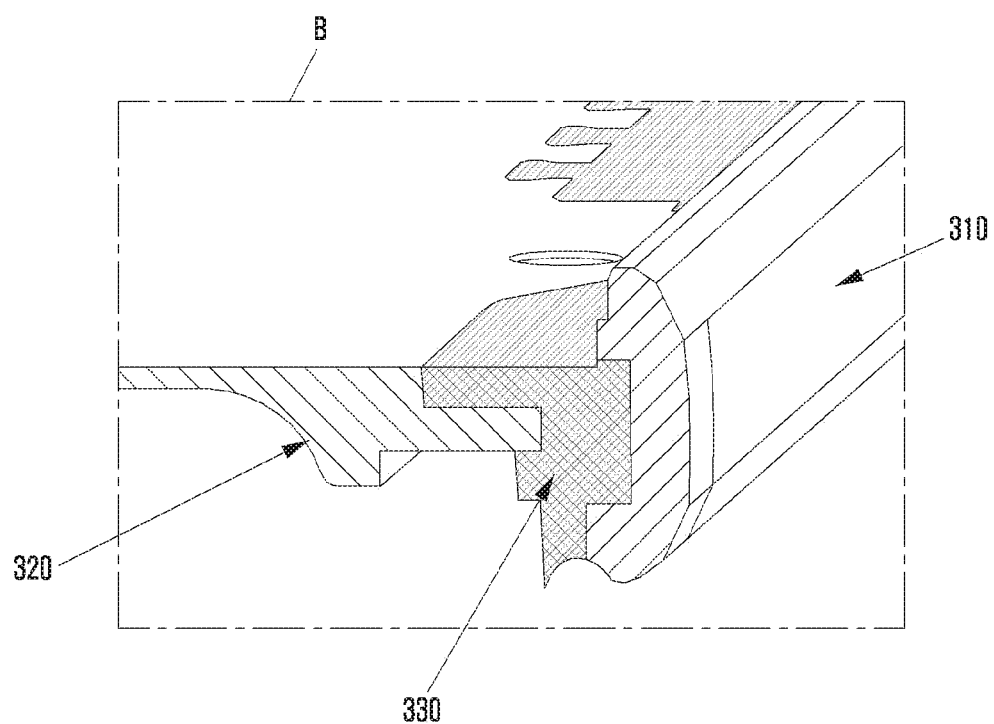
FIG. 4c is an exploded view illustrating a partial area B in the cross-sectional view of the metal housing according to various embodiments of the present invention.

FIG. 4c is an exploded view illustrating a partial area in the cross sectional view of the metal housing according to various embodiments of the present invention.

According to various embodiments, the metal frame 310, metal plate 320, and non-conductive bonding member 330 may include at least one of an interlacing structure, staggering structure, and extrusion-dent structure for a rigid bonding.

With reference to the exploded view of the partial area in the cross section view of the metal housing, a partial area of the metal plate 320, for example, an area extended to the outside of the metal housing 300, can protrude in a longitudinal direction. A partial area of the metal frame 310, for example, an area extended into the metal housing 300, may form a dent in the longitudinal direction. The non-conductive bonding member 330 can be formed with insert extrusion molding by filling an extrusion-dent structure of the metal frame 310 and the metal plate 320.

Figure 5A:
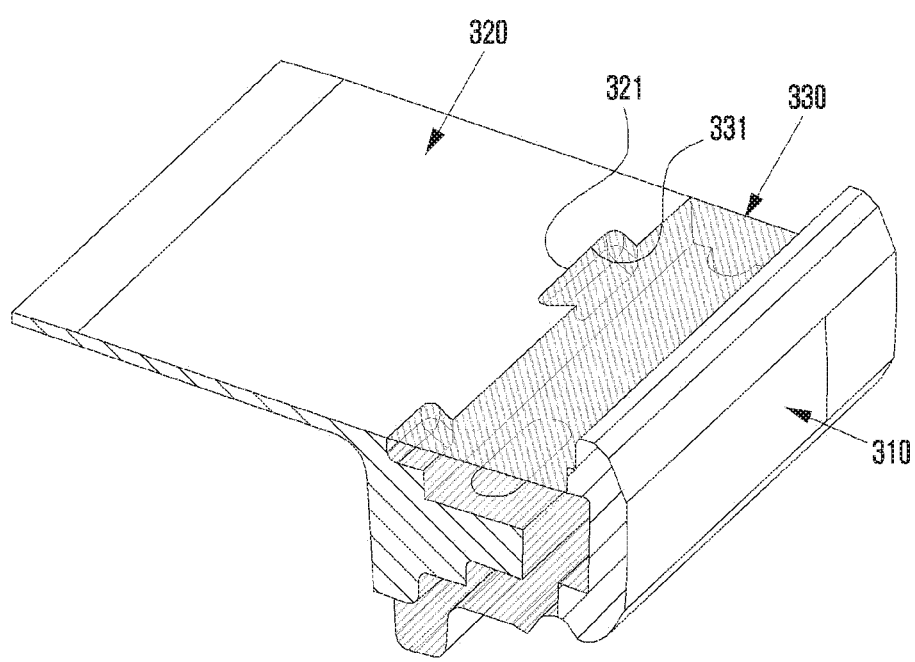
FIGS. 5a to 5c illustrate structures of a bonding member extruded in a metal housing according to various embodiments of the present invention.
Figure 5B:
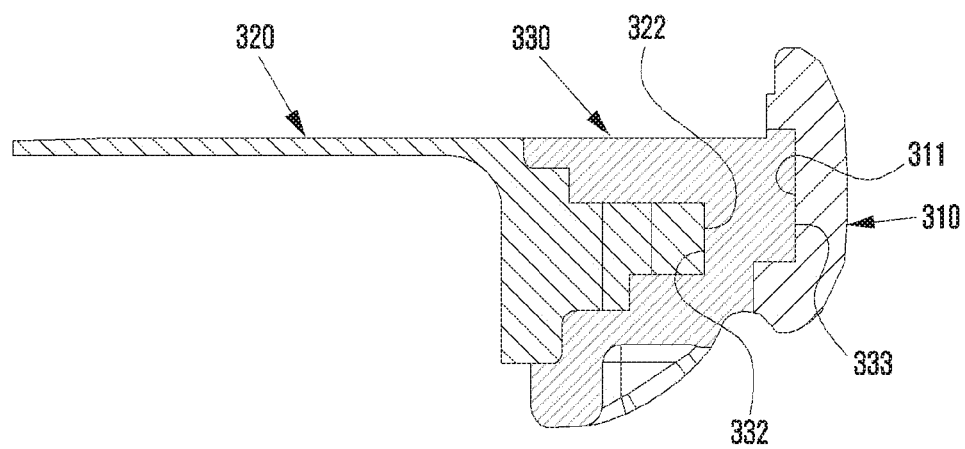
Figure 5C:
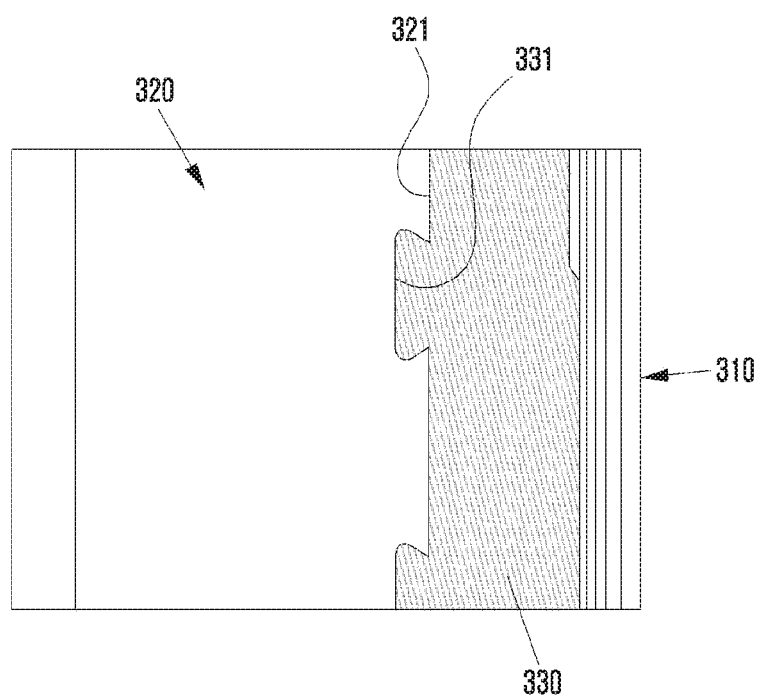

FIGS. 5a to 5c illustrate structures of a non-conductive bonding member 330 extruded in a metal housing 300 according to various embodiments of the present invention.

FIG. 5a is a perspective view illustrating a bonding structure of the non-conductive bonding member 330 extruded into the metal housing 300 according to various embodiments of the present invention, FIG. 5b is a cross sectional view illustrating a bonding structure of the non-conductive bonding member 330 extruded into the metal housing 300 according to various embodiments of the present invention, and FIG. 5c is a plane view illustrating a bonding structure of the non-conductive bonding member 330 extruded into the metal housing 300 according to various embodiments of the present invention.

According to various embodiments, the metal plate 320 may include at least one interlacing structure 321 having a toothed shape, and the non-conductive bonding member 330 can fill at least one interlacing structure 321 of the metal plate 320 having a toothed shape and form at least one interlacing structure 331 having a toothed shape.

According to various embodiments, the metal plate 320 may form a protrusion 322 longitudinally in a partial area, for example, an area extended to the outside of the metal housing 300. A partial area of the metal frame 310 may form a dent 311 longitudinally in an area extended into the metal housing 300. The non-conductive bonding member 330 may be extruded by insert extrusion molding and may fill an extrusion-dent structure of the metal frame 310 and the metal plate 320. The non-conductive bonding member 330 may form a dent 332 and protrusion 333 structure by filling the extrusion-dent structure of the metal frame 310 and the metal plate 320.

Figure 6A:
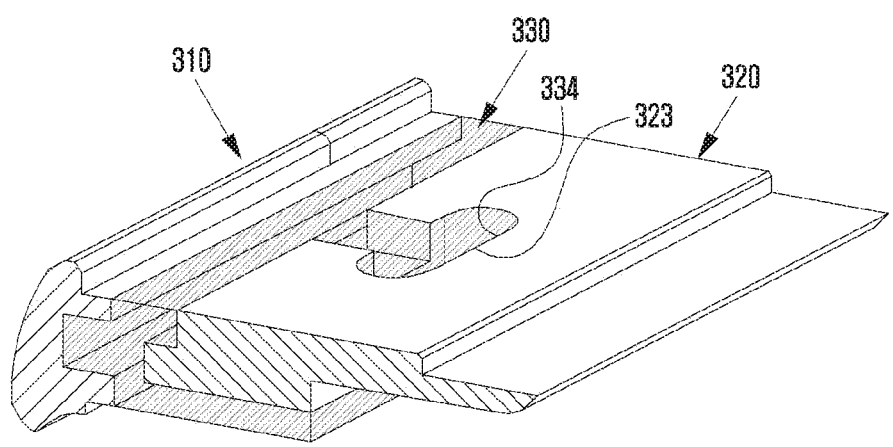
FIGS. 6a to 6c illustrate structures of a bonding member extruded in a metal housing according to various embodiments of the present invention.
Figure 6B:
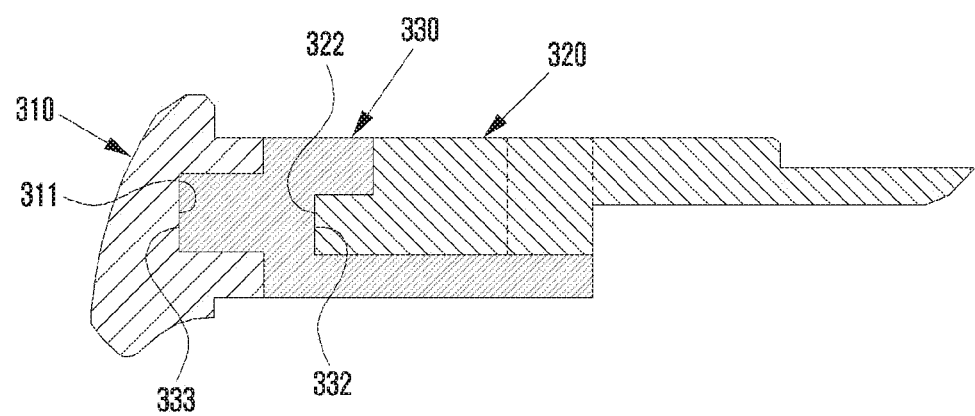
Figure 6C:
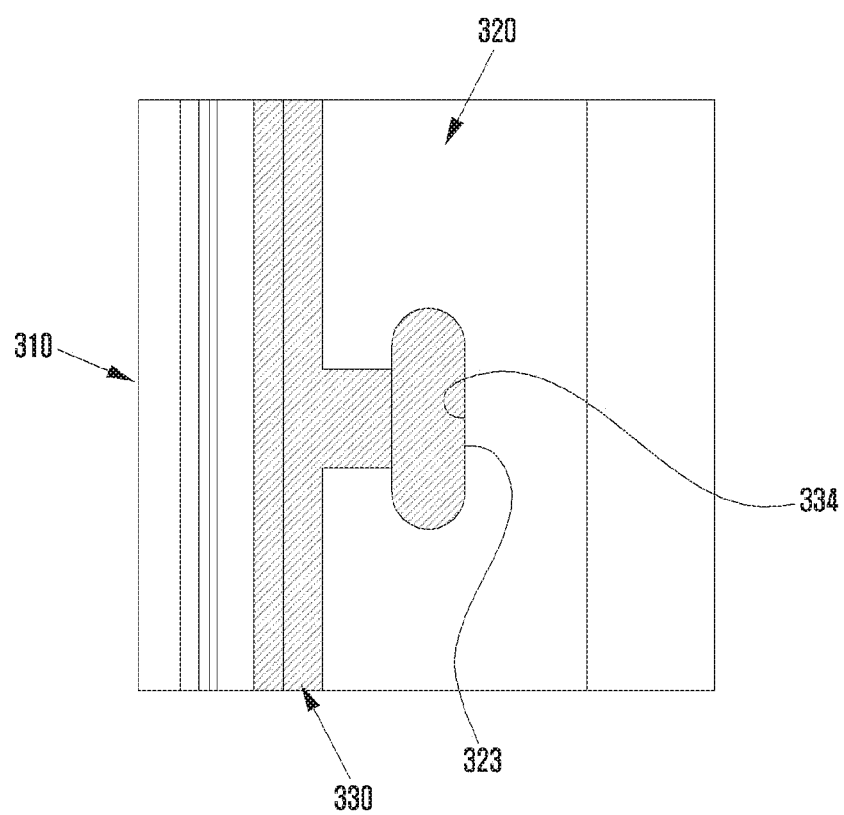

FIGS. 6a to 6c illustrate structures of a non-conductive bonding member 330 extruded in a metal housing 300 according to various embodiments of the present invention.

FIG. 6a is a perspective view illustrating a bonding structure of the non-conductive bonding member 330 extruded into the metal housing 300 according to various embodiments of the present invention, FIG. 6b is a cross sectional view illustrating a bonding structure of the non-conductive bonding member 330 extruded into the metal housing 300 according to various embodiments of the present invention, and FIG. 6c is a plane view illustrating a bonding structure of the non-conductive bonding member 330 extruded into the metal housing 300 according to various embodiments of the present invention.

According to various embodiments, the metal plate 320 may include at least one dented interlacing structure 323, and the non-conductive bonding member 330 may form a T-shaped interlacing structure 334 by filling the at least one interlacing structure 321 of the metal plate 320.

According to various embodiments, the metal plate 320 may form a protrusion 322 in a partial area such as an area extended to the outside of the metal housing 300. A partial area of the metal frame 310 such as an area extended into the metal housing 300 may form a dent 311 longitudinally. The non-conductive bonding member 330 may be extruded by filling an extrusion-dent structure of the metal frame 310 and the metal plate 320. The non-conductive bonding member 330 may form a dent 332 and protrusion 333 structure by filling the extrusion-dent structure of the metal frame 310 and the metal plate 320.

Figure 7:
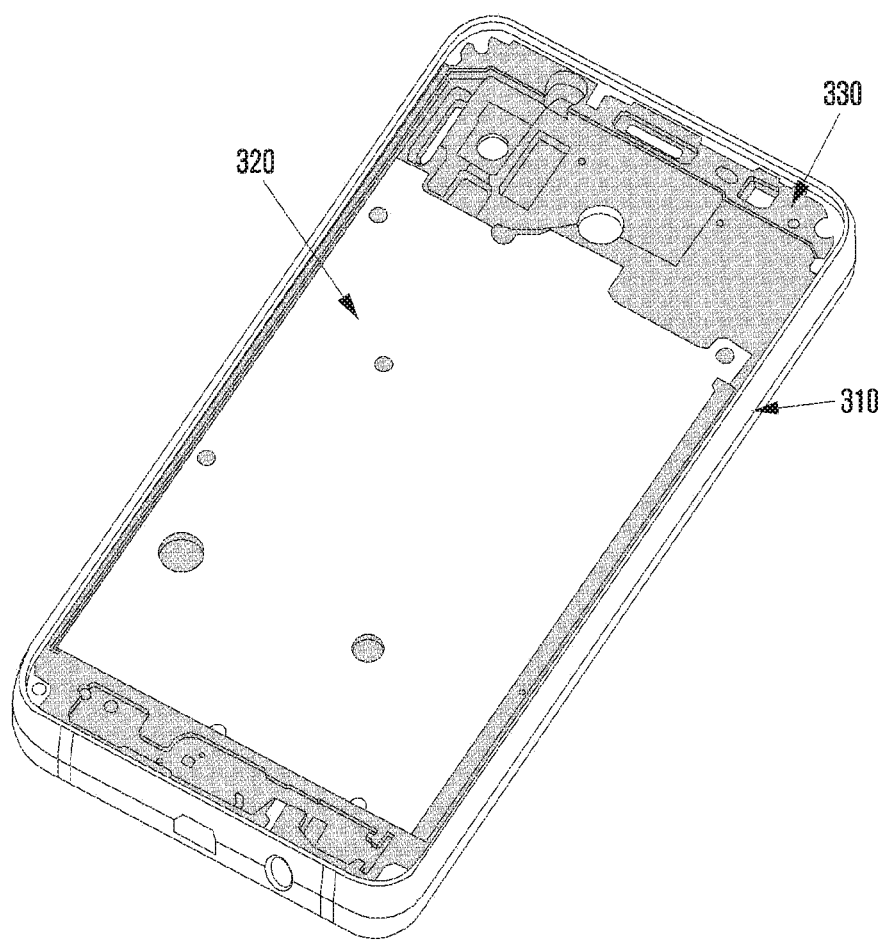
FIG. 7 illustrates a metal housing of an electronic device according to various embodiments of the present invention.

FIG. 7 illustrates a metal housing 300 of an electronic device 101 according to various embodiments of the present invention.

According to various embodiments, the metal frame 310 may be a metal frame 220 of FIG. 2 or a metal frame 220 of FIG. 1a. The metal plate 320 may be a metal plate 210 of FIG. 2.

According to various embodiments, the metal frame 310 can be formed by processing (e.g., CNC (computer numerical control) process) after primarily forming with one method of extrusion, forging, pressing, and casting.

According to various embodiments, the metal plate 320 can be formed with at least one method of die casting or pressing. The metal plate 320 according to various embodiments can be formed with the pressing method as shown in FIG. 7.

According to various embodiments, the metal plate 320 is disposed at an opening 340 of the metal frame 310, and if the non-conductive bonding member 330 is extruded by an extruder with an insert injection molding method, the non-conductive bonding member 330 can electrically separate and physically or chemically combine the metal frame 310 and the metal plate 320.

Figure 8:
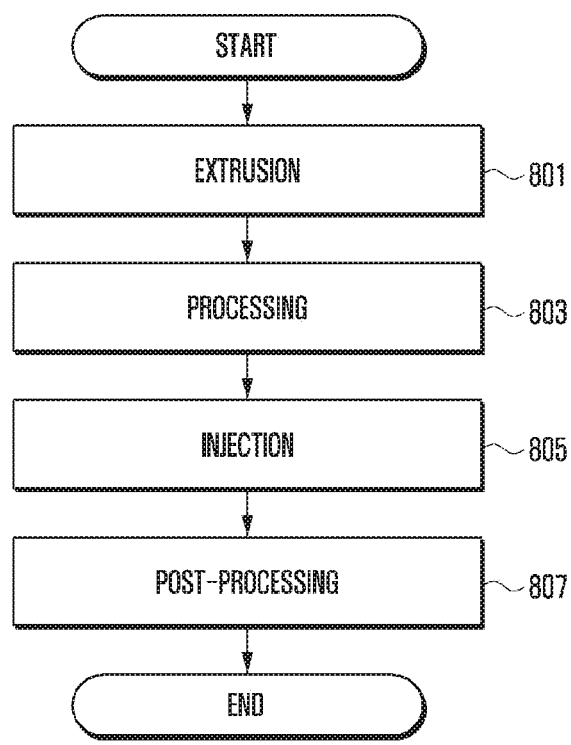
FIG. 8 is a flowchart illustrating a manufacturing process of a metal housing according to various embodiments of the present invention.

FIG. 8 is a flowchart illustrating a manufacturing process of a metal housing 300 according to various embodiments of the present invention.

At operation 801, a metal frame 310 having a first surface and a second surface opposite to the first surface and a metal plate 320 are formed.

According to various embodiments, the metal frame 310 can be formed to include an opening 340 penetrating the first surface and the second surface in a center part of the metal frame 310. At least one though hole smaller than the opening 340 can be formed at the periphery of the metal frame 310. The metal plate 320 may be formed smaller than the metal frame 310 so that the metal plate can be disposed at the opening 340 and displaced from the metal frame 310. The metal plate 320 may be formed to include a through hole in order to fix to an extruder.

According to various embodiments, the metal frame 310 can be formed with at least one manufacturing method of extrusion, forging, pressing, and casting.

According to various embodiments, the metal plate 320 can be formed with at least one manufacturing method of die casting or pressing.

At operation 803, at least one of the formed metal frame 310 and the formed metal plate 320 is processed. The operation of processing the at least one of the formed metal frame 310 and the formed metal plate 320 may be an operation of finishing the surfaces of the formed metal frame 310 and the formed metal plate 320 so that the formed metal frame 310 and the formed metal plate 320 can bond to each other while the bonding member 330 is extruded in the insert extrusion molding. The operation of processing the at least one of the formed metal frame 310 and the formed metal plate 320 may be a process of trimming an exterior (e.g., CNC process or casting product process).

At operation 805, a bonding member 330 is extruded by using an extruder. The operation of extruding a non-conductive bonding member 330 by using an extruder may include the operations of fixing a processed metal frame 310 in an extruder by using at least one part of a through hole, disposing a processed metal plate 320 in an opening 340 displacing at least one part of the metal plate 320 from the processed metal frame 310, filling the non-conductive bonding member 330 between the processed metal frame 310 and the processed metal plate 320 by using the extruder, and taking out a structure including the metal frame 310, metal plate 320, and non-conductive bonding member 330 from the extruder.

At operation 807, the structure taken out from the extruder is post-processed. The operation of post-processing the structure taken out from the extruder may include the operations of cutting at least one part of the periphery of the structure including a through hole and forming a metal frame 310 having no through hole. The operation of post-processing the structure taken out from the extruder may include a diamond-cutting operation for the metal frame 310 in order to give a metallic feeling to the metal frame 310.

Figure 9:
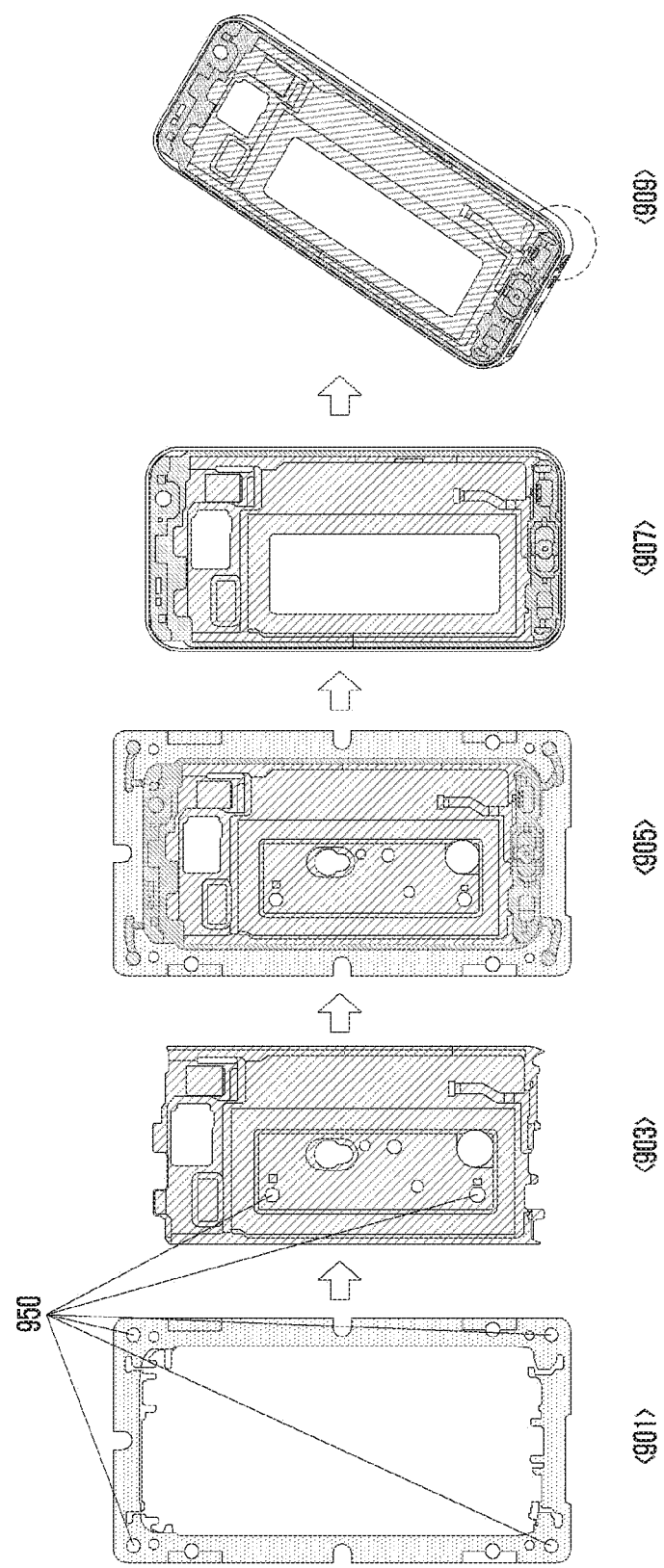
FIG. 9 illustrates a manufacturing process of a metal housing according to various embodiments of the present invention.

FIG. 9 illustrates a manufacturing process of a metal housing 300 according to various embodiments of the present invention.

At operation 901, at least one part of the center of the metal frame 310 is formed to include an opening 340 penetrating a first surface and a second surface. At least one through hole 950 smaller than the opening 340 may be formed and additionally processed at the periphery of the metal frame 310. At operation 903, the metal plate 320 is formed smaller than the metal frame 310 so that the metal plate 320 can be disposed at the opening 340 displaced from the metal frame 310. Here, the metal plate 320 can be formed with a casting method. At least one part of the metal plate 320 can be formed or additionally processed to include at least one through hole 950 smaller than the opening 340.

According to various embodiments, the through hole 950 is used for fixing the metal frame 310 and the metal plate 320 to an extrusion mold, and it may be formed by an additional process (e.g., CNC process or punching process) after primarily forming the metal frame 310 or the metal plate 320.

According to various embodiments, the through hole 950 can be formed by an additional process (e.g., CNC process or punching process) after marking a location of the through hole on the metal frame 310 in the extrusion mold.

At operation 905, the processed metal frame 310 is fixed in the extruder by using at least one part of the through hole 950, the processed metal plate 320 is disposed in the opening 340 by displacing at least one part of the processed metal plate 320 from the processed metal frame 310, a non-conductive bonding member 330 is filled between the processed metal plate 320 and the processed metal frame 310 by using the extruder, and a structure including the metal frame 310, metal plate 320, and non-conductive bonding member 330 is taken out from the extruder.

At operation 907, the structure taken out from the extruder is post-processed by cutting at least one part of the periphery including the through hole 950 and forming a metal frame 310 having no through hole 950.

At operation 909, a diamond-cutting is performed to esthetically vitalize a metallic feeling of the metal frame 310.

Figure 10:
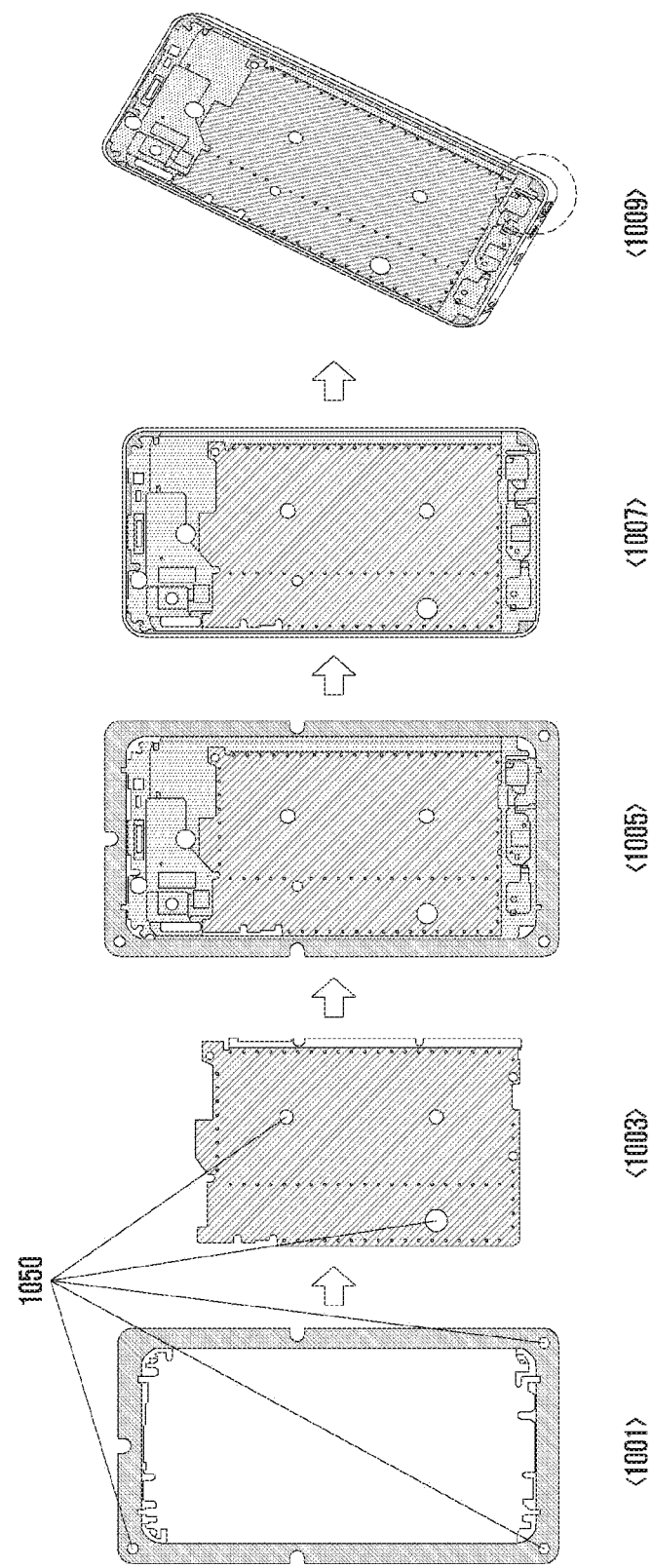
FIG. 10 illustrates a manufacturing process of a metal housing according to various embodiments of the present invention.

FIG. 10 illustrates a manufacturing process of a metal housing 300 according to various embodiments of the present invention.

At operation 1001, at least one part of the center of the metal frame 310 is formed to include an opening 340 penetrating a first surface and a second surface. At least one through hole 1050 smaller than the opening 340 may be formed and additionally processed at the periphery of the metal frame 310.

At operation 1003, the metal plate 320 is formed smaller than the metal frame 310 so that the metal plate 320 can be disposed at the opening 340 displacing from the metal frame 310. Here, the metal plate 320 can be formed with a pressing method. At least one part of the metal plate 320 can be formed or additionally processed to include at least one through hole 1050 smaller than the opening 340.

According to various embodiments, the through hole 1050 is used for fixing the metal frame 310 and the metal plate 320 to an extrusion mold, and it may be formed by an additional process (e.g., CNC process or punching process) after primarily forming the metal frame 310 or the metal plate 320.

According to various embodiments, the through hole 1050 can be formed by an additional process (e.g., CNC process or punching process) after marking a location of the through hole on the metal frame 310 in the extrusion mold.

At operation 1005, the processed metal frame 310 is fixed in the extruder by using at least one part of the through hole 1050, the processed metal plate 320 is disposed in the opening 340 by displacing at least one part of the processed metal plate 320 from the processed metal frame 310, a non-conductive bonding member 330 is filled between the processed metal plate 320 and the processed metal frame 310 by using the extruder, and a structure including the metal frame 310, metal plate 320, and non-conductive bonding member 330 is taken out from the extruder.

At operation 1007, the structure taken out from the extruder is post-processed by cutting at least one part of the periphery including the through hole 1050 and forming a metal frame 310 having no through hole 1050.

At operation 1009, diamond cutting is performed for the metal frame 310 to esthetically vitalize a metallic feeling of the metal frame 310.

Examples of non-transitory computer-readable media include magnetic media such as a hard disk, floppy disk, and magnetic tape; optical media such as a compact disc read only memory (CD-ROM) disk and a digital versatile disc (DVD); magneto-optical media such as a floptical disk; and hardware devices that are configured to store and perform program instructions (e.g., programming modules) such as a ROM, a RAM, and a flash memory. Examples of program instructions include machine code instructions generated using assembly languages, such as by a compiler, and code instructions created using a high-level programming language executable in computers using an interpreter, etc. The hardware devices described above may be configured to act as one or more software modules in order to perform the operations and methods described above, or vice versa.

A module or programming module according to various embodiments may include at least one of the above-mentioned components, may not include some of the above-mentioned components, or may further include other components. Operations performed by a module, programming module, or other components according to various embodiments of the present disclosure may be executed through a sequential, parallel, repetitive, or heuristic method. Additionally, some operations may be executed in different orders or may be omitted, and other operations may be added. While the present disclosure has been shown and described with reference to various embodiments thereof, it will be understood by those skilled in the art that various changes in forms and details may be made therein without departing from the spirit and scope of the present disclosure as defined by the appended claims and their equivalents.

The invention claimed is:

1. An electronic device comprising:
   a metal frame including an opening at a center part of the metal frame;
   a metal plate included in the opening and having at least one part displaced from the metal frame;
   a bonding member configured to fix the metal plate to the metal frame and fill a gap between the metal frame and the metal plate;
   a printed circuit board configured to contact with or disposed adjacent to a surface of the metal plate;
   a communication module mounted on the printed circuit board and electrically connected to at least one part of the metal frame;
   a display configured to contact with or disposed adjacent to the surface of the metal plate or another surface of the metal plate;
   a first plate configured to cover at least one part of the display while forming a part of an external housing together with the metal frame; and
   a second plate configured to cover the opposite side of the display and form a part of the external housing together with the metal frame.

2. The electronic device of claim 1, wherein the metal plate and the bonding member are combined with each other through a physical or chemical bonding.

3. The electronic device of claim 1, wherein the metal frame and the bonding member are combined with each other through a physical or chemical bonding.

4. The electronic device of claim 1, wherein the first plate is a display window.

5. The electronic device of claim 1, wherein the second plate is a rear cover.

6. The electronic device of claim 1, wherein the bonding member is formed with an insulating material or a non-metallic material.

7. The electronic device of claim 1, wherein at least one of the metal frame, the metal plate and the bonding member comprises at least one of an interlacing structure, a staggering structure, and an extrusion-dent structure.

8. The electronic device of claim 7, wherein the interlacing structure is a toothed structure or a T-shaped structure.

* * * * *